(12) United States Patent
Sadd et al.

(10) Patent No.: US 7,622,349 B2
(45) Date of Patent: Nov. 24, 2009

(54) FLOATING GATE NON-VOLATILE MEMORY AND METHOD THEREOF

(75) Inventors: Michael A. Sadd, Austin, TX (US); Gowrishankar L. Chindalore, Austin, TX (US); Cheong M. Hong, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 303 days.

(21) Appl. No.: 11/302,937

(22) Filed: Dec. 14, 2005

(65) Prior Publication Data

US 2007/0134867 A1    Jun. 14, 2007

(51) Int. Cl.
H01L 21/8239    (2006.01)
H01L 21/28    (2006.01)

(52) U.S. Cl. .................. 438/257; 438/588; 257/316; 257/319; 257/320; 257/E29.3; 257/E23.301

(58) Field of Classification Search .............. 438/257, 438/279, 201, 587, 588; 257/314, 315, 316, 257/319, 320, E29.3, E29.301
See application file for complete search history.

(56) References Cited

U.S. PATENT DOCUMENTS

| | | | |
|---|---|---|---|
| 5,705,415 A | 1/1998 | Orlowski et al. | |
| 5,898,197 A * | 4/1999 | Fujiwara | 257/317 |
| 5,969,383 A | 10/1999 | Chang et al. | |
| 6,246,088 B1 * | 6/2001 | Chang | 257/314 |
| 6,307,782 B1 | 10/2001 | Sadd et al. | |
| 6,313,500 B1 * | 11/2001 | Kelley et al. | 257/316 |
| 6,330,184 B1 | 12/2001 | White et al. | |
| 6,399,441 B1 | 6/2002 | Ogura et al. | |
| 6,583,466 B2 | 6/2003 | Lin et al. | |
| 6,644,583 B2 * | 11/2003 | Schmidt | 242/419.4 |
| 6,674,121 B2 * | 1/2004 | Misra et al. | 257/324 |
| 6,686,245 B1 | 2/2004 | Mathew et al. | |
| 6,706,599 B1 | 3/2004 | Sadd et al. | |
| 6,774,430 B2 * | 8/2004 | Horiguchi et al. | 257/316 |
| 6,815,759 B2 * | 11/2004 | Horiguchi et al. | 257/316 |
| 6,818,512 B1 | 11/2004 | Hsieh | |
| 6,831,310 B1 * | 12/2004 | Mathew et al. | 257/270 |
| 6,831,325 B2 * | 12/2004 | Lojek | 257/315 |
| 6,987,298 B2 * | 1/2006 | Lee et al. | 257/324 |
| 6,991,986 B2 * | 1/2006 | Lee | 438/261 |
| 7,020,018 B2 * | 3/2006 | Hsieh et al. | 365/185.03 |
| 7,081,651 B2 * | 7/2006 | Choi et al. | 257/324 |
| 7,082,057 B2 * | 7/2006 | Shibata et al. | 365/185.2 |
| 7,087,182 B2 * | 8/2006 | Weimer | 216/58 |
| 7,095,077 B2 * | 8/2006 | Kataoka et al. | 257/324 |

(Continued)

OTHER PUBLICATIONS

Guan, H., et al. "An Analytical Model for Optimization of Programming Efficiency and Uniformity of Split Gate Source-Side Injection Superflash Memory," IEEE Transactions on Electron Devices, vol. 50, No. 3, Mar. 2003, pp. 809-815.

(Continued)

Primary Examiner—M. Wilczewski

(57) ABSTRACT

A method is provided which includes forming a first gate overlying a major surface of an electronic device substrate and forming a second gate overlying and spaced apart from the first gate. The method further includes forming a charge storage structure horizontally adjacent to, and continuous along, the first gate and the second gate, wherein a major surface of the charge storage structure is substantially vertical to the major surface of the substrate.

19 Claims, 8 Drawing Sheets

U.S. PATENT DOCUMENTS

| | | | | |
|---|---|---|---|---|
| 7,102,192 | B2 * | 9/2006 | Ono | 257/316 |
| 7,119,394 | B2 * | 10/2006 | Hsieh et al. | 257/316 |
| 7,127,624 | B2 * | 10/2006 | Berman et al. | 713/320 |
| 7,163,860 | B1 * | 1/2007 | Kamal et al. | 438/257 |
| 7,242,052 | B2 * | 7/2007 | Kuo et al. | 257/316 |
| 7,405,119 | B2 * | 7/2008 | Lee et al. | 438/216 |
| 2002/0151136 | A1 | 10/2002 | Lin et al. | |
| 2003/0198086 | A1 * | 10/2003 | Shukuri | 365/185.18 |
| 2003/0198104 | A1 * | 10/2003 | Lee | 365/200 |
| 2004/0000688 | A1 | 1/2004 | Harari et al. | |
| 2004/0014284 | A1 * | 1/2004 | Kim et al. | 438/257 |
| 2004/0232475 | A1 * | 11/2004 | Kataoka et al. | 257/315 |
| 2004/0233724 | A1 * | 11/2004 | Shibata et al. | 365/185.18 |
| 2004/0248371 | A1 | 12/2004 | Wang | |
| 2005/0037575 | A1 * | 2/2005 | Lee | 438/257 |
| 2005/0037576 | A1 | 2/2005 | Chen et al. | |
| 2005/0062092 | A1 * | 3/2005 | Lojek | 257/315 |
| 2006/0006457 | A1 * | 1/2006 | Ono | 257/316 |
| 2006/0086967 | A1 * | 4/2006 | Hsieh et al. | 257/314 |
| 2007/0001218 | A1 * | 1/2007 | Hong et al. | 257/325 |
| 2007/0052000 | A1 * | 3/2007 | Lee | 257/314 |
| 2007/0075354 | A1 * | 4/2007 | Ono et al. | 257/315 |
| 2007/0108503 | A1 * | 5/2007 | Chen et al. | 257/316 |
| 2007/0108504 | A1 * | 5/2007 | Lee et al. | 257/316 |
| 2007/0126025 | A1 * | 6/2007 | Yuda | 257/192 |
| 2007/0134867 | A1 * | 6/2007 | Sadd et al. | 438/201 |
| 2007/0161195 | A1 * | 7/2007 | Lee et al. | 438/287 |
| 2007/0164352 | A1 * | 7/2007 | Padilla et al. | 257/324 |
| 2007/0166917 | A1 * | 7/2007 | Tzeng et al. | 438/257 |
| 2007/0176223 | A1 * | 8/2007 | Chindalore et al. | 257/314 |
| 2007/0205455 | A1 * | 9/2007 | Zheng et al. | 257/314 |
| 2007/0212841 | A1 * | 9/2007 | Lee et al. | 438/303 |
| 2007/0215933 | A1 * | 9/2007 | Yuda | 257/315 |
| 2007/0272974 | A1 * | 11/2007 | King et al. | 257/316 |
| 2008/0080245 | A1 * | 4/2008 | Liu | 365/185.15 |
| 2008/0093686 | A1 * | 4/2008 | Yun et al. | 257/415 |
| 2008/0128791 | A1 * | 6/2008 | Lee et al. | 257/326 |
| 2008/0157169 | A1 * | 7/2008 | Yuan | 257/319 |
| 2008/0315291 | A1 * | 12/2008 | Kito et al. | 257/324 |

OTHER PUBLICATIONS

Hayashi, Y., et al. "Twin MONOS Cell with Dual Control Gates," 2000 Symposium on VLSI Technology Digest of Technical Papers, 2000, pp. 122-123.

Lee, D., et al. "Vertical Floating-Gate 4.5F2 Split-Gate NOR Flash Memory at 110nm Node," 2004 Symposium on VLSI Technology Digest of Technical Papers, 2004, pp. 72-73.

Ma, Y. et al. "A Dual-Bit Split-Gate EEPROM (DSG) Cell in Contactless Array for Single-Vcc High Density Flash Memories," IEDM, 1994, p. 57-60.

Osabe, T. et al. "Charge-Injection Length in Silicon Nanocrystal Memory Cells," 2004 Symposium on VLSI Technology Digest of Technical Papers, 2004, p. 242-243.

Van Houdt, J., et al. "An Analytical Model for the Optimization of Source-Side Injection Flash EEPROM Devices," IEEE Transactions on Electron Devices, vol. 42, No. 7, Jul. 1995, pp. 1314-1320.

Denton, J., et al. "Fully Depleted Dual-Gated Thin-Film SOI P-MOSFET's Fabricated in SOI Islands with an Isolated Buried Polysilicon Backgate," IEEE Electron Device Letters, vol. 17, No. 11, Nov. 1996, pp. 509-511.

Jung, S., et al. "Highly Area Efficient and Cost Effective Double Stacked S3 (Stacked Single-crystal Si) Peripheral CMOS SSTFT and SRAM Cell Technology for 512M bit Density SRAM," IEEE 2004, 4 pages.

Pfiester, J.R., et al. "A Compact Inverted-Spacer TFT for High-Density SRAMs," 1994 Symposium on VLSI Technology Digest of Technical Papers, 1994 IEEE, pp. 101-102.

Silva, H., et al. "A Nanoscale Memory and Transistor Using Backside Trapping," IEEE Transactions on Nanotechnology, vol. 3, No. 2, Jun. 2004, pp. 264-269.

Avci, U., et al. "Back-Gated MOSFETs with Controlled Silicon Thickness for Adaptive Threshold-Voltage Control,"Electronics Letters, vol. 40, Issue 1, Jan. 8, 2004, pp. 74-75.

U.S. Appl. No. 11/188,999, filed Jul. 25, 2005.
U.S. Appl. No. 11/188,953, filed Jul. 25, 2005.
U.S. Appl. No. 11/188,898, filed Jul. 25, 2005.
U.S. Appl. No. 11/188,910, filed Jul. 25, 2005.
U.S. Appl. No. 11/188,909, filed Jul. 25, 2005.
U.S. Appl. No. 11/188,591, filed Jul. 25, 2005.
U.S. Appl. No. 11/188,939, filed Jul. 25, 2005.
U.S. Appl. No. 11/188,588, filed Jul. 25, 2005.
U.S. Appl. No. 11/188,603, filed Jul. 25, 2005.
U.S. Appl. No. 11/188,615, filed Jul. 25, 2005.
U.S. Appl. No. 11/188,582, filed Jul. 25, 2005.
U.S. Appl. No. 11/188,583, filed Jul. 25, 2005.
U.S. Appl. No. 11/188,604, filed Jul. 25, 2005.
U.S. Appl. No. 11/188,585, filed Jul. 25, 2005.
U.S. Appl. No. 11/188,584, filed Jul. 25, 2005.
U.S. Appl. No. 11/188,935, filed Jul. 25, 2005.
U.S. Appl. No. 10/961,295, filed Oct. 8, 2004.
U.S. Appl. No. 11/079,674, filed Mar. 14, 2005.

* cited by examiner

FLOATING GATE NON-VOLATILE MEMORY AND METHOD THEREOF

BACKGROUND

1. Field of the Disclosure

The present disclosure relates to electronic devices and processes, and more particularly, to electronic devices that include non-volatile memory devices and processes for forming and using the same.

2. Description of the Related Art

Floating gate non-volatile memories ("FG NVM") are commonly used in many applications. The two most common types of programming mechanisms for FG NVM include Fowler-Nordheim tunneling and hot carrier injection. Fowler-Nordheim tunneling is efficient but relatively slow. Efficiency can be measured by dividing the number of carriers that enter a floating gate by the number of carriers that enter a memory cell having the floating or the other storage element(s). The latter number can be approximated by using the product of the programming current and the programming time.

Hot carrier injection can include conventional hot carrier injection and source-side injection. Both involve the generation of hot carriers, some of which are injected into the floating gate or the other storage element(s). In conventional hot carrier injection when using a floating gate, an electrical field is generated along a channel region of a memory cell. Within the channel region, the electrical field is the highest near the drain region. The electrical field accelerates carriers flowing within the channel region, such that, within the channel region, the carriers are traveling the fastest near the drain region. A fraction of carriers having energies large enough to overcome the dielectric barrier are hot carriers. A small fraction of these hot carriers scatter within the channel region, and they are attracted by an electrical field generated by the control gate electrode, which can help inject some into the floating gate through a dielectric region separating the channel from the floating gate. Conventional hot carrier injection has a high programming current and is inefficient.

Source-side injection is a popular compromise, with respect to efficiency and programming current, between Fowler-Nordheim tunneling and conventional hot carrier injection. With source-side injection, hot carriers are still generated; however most of the hot carriers are generated within a portion of the channel region that is spaced apart from the drain region. Memory cells designed for programming by source-side injection are not without problems. Typically, the memory cells require one or more additional critical lithographic sequences and result in larger memory cells. As such, high-density floating gate memories are becoming more difficult to fabricate in commercial volumes.

Accordingly, there continues to be a need in the industry for memory cells having alternate designs, particularly memory cells that utilize injection techniques and are capable of providing improved channel structures, efficiency, and programming current responsiveness as well as read current responsiveness.

BRIEF DESCRIPTION OF THE DRAWINGS

The present disclosure may be better understood, and its numerous features and advantages made apparent to those skilled in the art by referencing the accompanying drawings. The disclosure is illustrated by way of example and not limitation in the accompanying figures.

The use of the same reference symbols in different drawings indicates similar or identical items.

Figure 1:
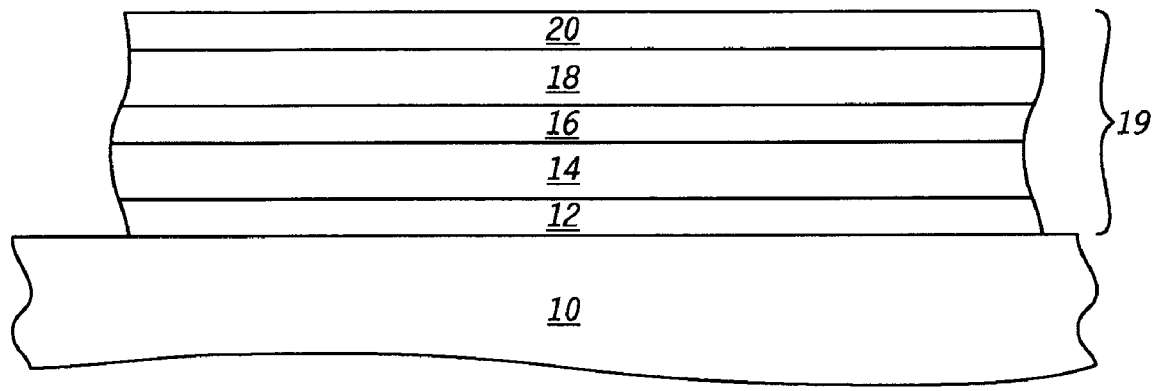
FIG. 1 is a cross sectional view of a region of a workpiece having a plurality of overlying layers forming a stack.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the disclosure.

DETAILED DESCRIPTION

Clarification of specific terms will be useful prior to discussing specific embodiments of the present disclosure.

The term "substrate" herein is intended to mean a base material. An example of a substrate includes a quartz plate, a monocrystalline semiconductor wafer, a semiconductor-on-insulator wafer, etc. The reference point for a substrate is the beginning point of a process sequence.

The term "workpiece" herein is intended to mean a substrate and, if any, one or more layers and openings, or any combination thereof attached to the substrate, at any particular point of a process sequence to form structures. Note that the substrate may not significantly change during a process sequence, whereas the workpiece significantly changes during the process sequence. For example, at the beginning of a process sequence, the substrate and workpiece are the same.

After a layer is formed over the substrate, the substrate has not changed, but now the workpiece includes the combination of the substrate and the layer.

The term "discontinuous storage elements" herein is intended to mean spaced-apart objects capable of storing a charge independent of one another. In one embodiment, substantially all discontinuous storage elements may be initially formed and remain separate from one another. In another embodiment, substantially all discontinuous storage elements may be initially formed separate from one another, and later during the formation, some but not all of the discontinuous storage elements may coalesce.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this disclosure belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

Various features and advantages of the present disclosure will be apparent from the following detailed description, and from the claims. To the extent not described herein, many details regarding specific materials, processing acts, and circuits are conventional and thereby known by those skilled in the art associated with the present disclosure.

Referring to FIG. 1, a workpiece 9 is illustrated according to a specific embodiment of the present disclosure and includes a stack 19 formed over a portion of a substrate 10. According to one embodiment, the substrate 10 includes a single crystal semiconductor material. Substrates suitable for the purposes described herein, include silicon, germanium, semiconductor on insulator (SOI), silicon on sapphire, or silicon on nitride substrates.

An ion implant process of substrate 10 can be performed to provide dopants at its surface. Ion implantation (not specifically illustrated) of the substrate 10 at the location of stack 19 reduces potential leakage and interference between conductive lines formed subsequently over the surface of the substrate 10 and additionally counter-acts future ion implantation procedures. The ion implantation procedure may be completed using conventional and proprietary techniques as are know in the art. In one embodiment, a dopant is introduced to substrate 10 prior to forming the stack 19 to form doped regions (not illustrated) within the substrate 10. The dopant may be a p-type dopant (e.g., boron) or an n-type dopant (e.g., phosphorus or arsenic). After introducing the dopant through ion implantation, an optional thermal cycle can be performed to activate the dopant. In another embodiment, subsequent processing may have one or more thermal cycles capable of activating the dopant. As such, the doping concentration is at least approximately $5\times10^{17}$ atoms/cm$^3$.

According to the illustrated embodiment of FIG. 1, stack 19 comprises a plurality of layers overlaying a portion of the substrate 10. It should be appreciated that the stack 19 can overlay some or all of the substrate 10 and only a portion of the entire stack 19 and substrate 10 are illustrated, as represented by the use of wavy edges. The layers of stack 19 can include a variety of materials and a variety of thicknesses. In one embodiment, layers 12, 16, and 20 include a dielectric or insulating material such as silicon dioxide, silicon nitride, silicon oxynitride, a high dielectric constant ("high-k") material (e.g., dielectric constant greater than 8), or any combination thereof while layers 14 and 18 comprise a conductive material, such as a doped silicon layer, a metal, or the like. In a specific embodiment, layers 12, 16, and 20 include silicon dioxide and layers 14 and 18 include a metal, which can include a conductive metal oxide or metal nitride. Layers 14 and 18 facilitate the formation of conductive gates of a multi-gate transistor structure that is further defined by layer 16 between layers 14 and 18 from which conductive gates will be formed. Each of the layers 12, 14, 16, 18, and 20 comprising the stack 19 can be formed by conventional and proprietary growth and deposition techniques known in the art. According to one embodiment, the dielectric layers of the stack 19 are thermally grown using an oxidizing or nitridizing ambient. Other embodiments contemplate formation of the layers using a chemical vapor deposition technique, physical vapor deposition techniques, atomic layer deposition techniques, or a combination thereof.

According to one embodiment, layers 12 and 16 have a thickness less than approximately 300 Angstroms, which includes a thickness of less than approximately 100 Angstroms; layers 14 and 18 have a thickness less than approximately 900 Angstroms, which includes a thickness of less than approximately 500 Angstroms; while layer 20 has a thickness less than approximately 500 Angstroms, which includes a thickness of less than approximately 250 Angstroms. Other embodiments beyond those discussed and illustrated with respect to FIG. 1 are contemplated and can include a variety of layers using different materials, suitable for forming the final electronic device in the manner described herein.

Figure 2:
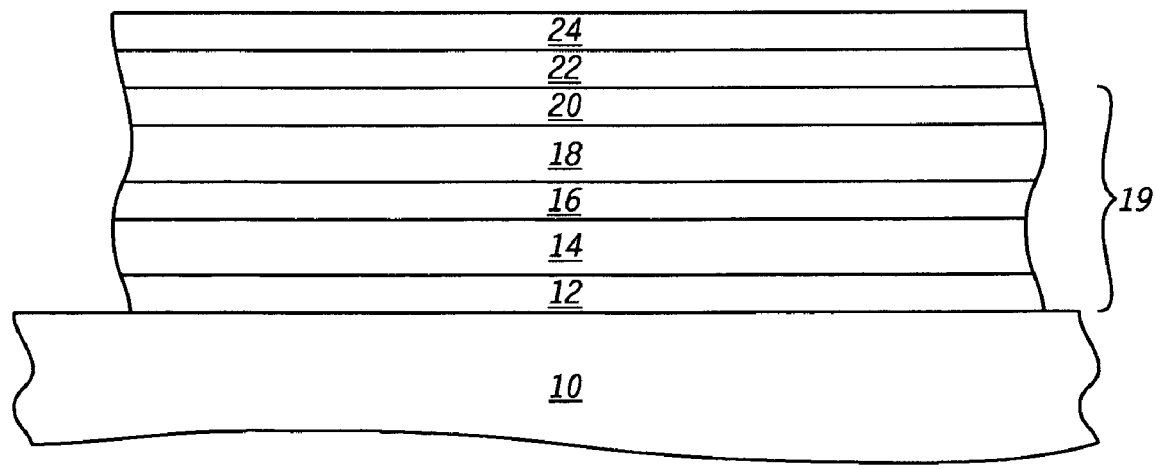
FIG. 2 is a view of the workpiece of FIG. 1 after forming additional layers overlying the stack.

FIG. 2 illustrates a specific embodiment of workpiece 9 having additional layers 22 and 24 overlying stack 19. The additional layers 22 and 24 are formed to facilitate later processing and can comprise a variety of materials in a variety of arrangements. In one embodiment, layer 22 is a masking layer that will facilitate subsequent removal of portions of stack 19. Layer 22 can include a material comprising a nitride, such as silicon nitride, like silicon oxy-nitride, other metal nitrides, combinations thereof, and the like. According to the illustrated embodiment of FIG. 2, layer 24 overlays layer 22. Layer 24 can include some of the same materials as one or more of the layers of the stack 19, for example, a dielectric or insulating material such as silicon dioxide. Additional layers 22 and 24 can be deposited or grown using conventional and proprietary techniques known in the art. In one embodiment, each of the additional layers 22 and 24 have a thickness not greater than approximately 500 Angstroms, such as not greater than approximately 250 Angstroms.

Figure 3:
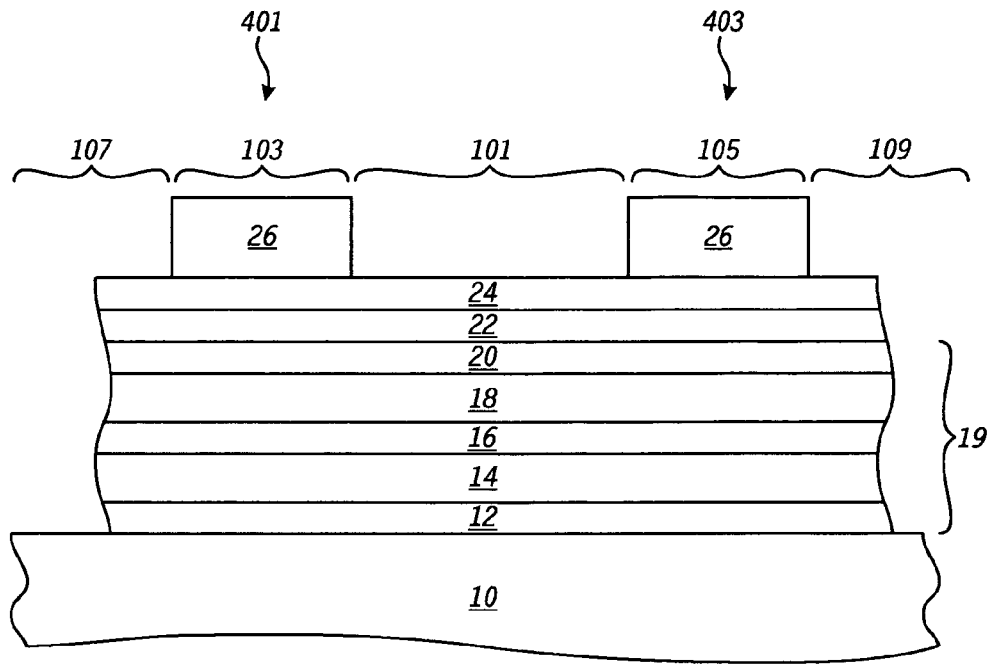
FIG. 3 is a view of the workpiece of FIG. 2 after masking portions of the stack and additional layers.

FIG. 3 illustrates workpiece 9 subsequent to forming a layer 26 over the workpiece 9 of FIG. 2, to provide a mask that defines uncovered regions 101, 107 and 109, where openings in layer 26 exist. Portions of layer 24 are unexposed or covered at regions 103 and 105 by the overlaying layer 26. Typically, layer 26 can comprise a photoresist or a hard mask formed by patterning processes that include lithographic. Suitable materials for layer 26 can include nitrides, such as silicon oxy-nitrides or other silicon nitrides and metal nitrides, combinations thereof, or the like. According to one embodiment, layer 26 has a thickness not greater than approximately 10000 Angstroms.

Figure 4:
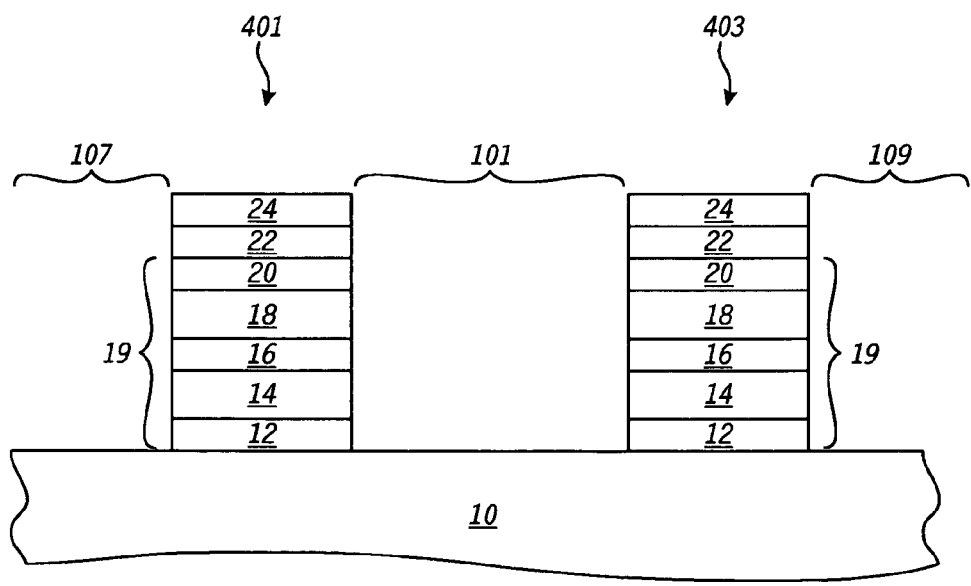
FIG. 4 is a view of the workpiece of FIG. 3 after etching portions of the stack and additional layers.

Referring to the specific embodiment of FIG. 4, portions of the stack 19 and layers 22 and 24 at regions 101, 107 and 109 have been removed. According to one embodiment, an etch process is used to remove portions of the stack 19 and the additional layers 22 and 24. Remaining portions of stack 19 form multi-gate stacks, each having conductive gates formed from layers 14 and 18, and opposing sidewalls. According to one embodiment, etching of the layers at uncovered regions 101, 107 and 109 can include techniques such as a dry etch. Layer 26 has also been removed from uncovered regions 101, 107, and 109. Layer 26 can be removed using conventional and proprietary techniques, such as an ashing for photoresist materials or other techniques depending upon the composition of layer 26. According to the illustrated embodiment of FIG. 4, removing the layers at uncovered regions 101, 107 and 109, results in the formation of layered structures at locations 401 and 403 at which multi-bit cell memory structures are being formed. According to one embodiment, the multi-bit cell structures being formed at locations 401 and 403 will share a common word line.

Figure 5:
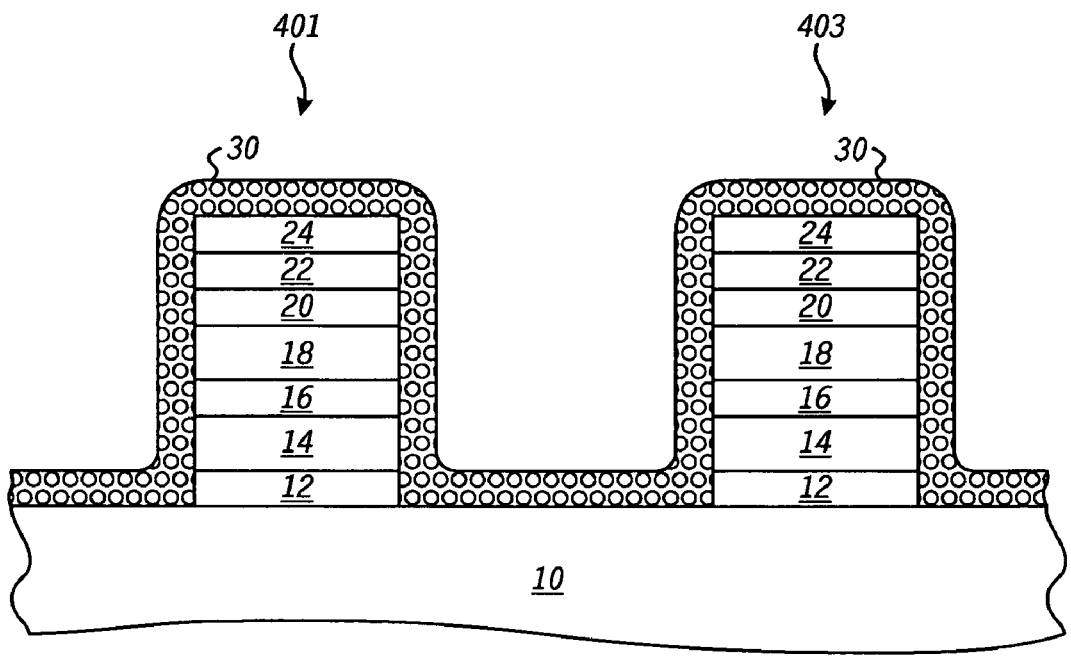
FIG. 5 is a view of the workpiece of FIG. 4 after forming a charge storage structure layer over a portion of the substrate, the stack, additional layers and the mask.

FIG. 5 illustrates one embodiment of the workpiece 9 after the formation of layer 30 over the workpiece 9. Layer 30 can include a charge storage material capable of storing a charge, and is formed adjacent to and continuous along the multi layered structures at locations 401 and 403, such that a portion of layer 30 is substantially perpendicular (vertical as shown) to the major surface of the substrate 10. Layer 30 can include charge storage materials, such as a material comprising one or more of silicon, a nitride, a metal-containing material or a combination thereof. According to one embodiment, layer 30 includes discontinuous storage elements surrounded by a dielectric material. The discontinuous storage elements are substantially physically separated from each other. Discontinuous storage elements comprises a material capable of storing a charge, such as a material comprising silicon, a nitride, a metal-containing material, a metal nitride, another suitable material capable of storing charge, or any combination thereof. In one embodiment, discontinuous storage elements can be formed from one or more materials whose properties are not significantly adversely affected during a thermal oxidation process. Such a material can include platinum, palladium, iridium, osmium, ruthenium, rhenium, indium-tin, indium-zinc, aluminum-tin, or any combination thereof. Each of such materials, other than platinum and palladium, may form a conductive metal oxide. In one particular embodiment, discontinuous storage elements are silicon crystals. In one embodiment, each of discontinuous storage elements is less than approximately 10 nm in any dimension. In another embodiment, discontinuous storage elements can be larger, however, discontinuous storage elements are not formed so large as to form a continuous structure (i.e., all discontinuous storage elements are not fused together).

Layer 30 can include one or more films (i.e. layers) of a dielectric material layer, such as silicon dioxide, silicon nitride, silicon oxynitride, a high dielectric constant ("high-k") material (e.g., dielectric constant greater than 8), or any combination thereof. The high-k material can include $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_a$, $Zr_bO_c$, $Zr_aSi_bO_c$, $Zr_aSi_bO_cN_d$, $ZrO_2$, other Hf-containing or Zr-containing dielectric material, a doped version of any of the foregoing (lanthanum doped, niobium doped, etc.), or any combination thereof. According to one embodiment, the dielectric material layer may be thermally grown using an oxidizing or nitridizing ambient, or deposited using a chemical vapor deposition technique, physical vapor deposition technique, atomic layer deposition technique, or a combination thereof. In one embodiment, the dielectric material layer has a thickness less than approximately 50 nm. The thickness and material selection of dielectric material layer will be selected based upon desired electrical properties of the bit cells being formed. In one embodiment the thickness and material are chosen such that dielectric layer has a silicon dioxide equivalent thickness of less than 12 nm.

Figure 6:
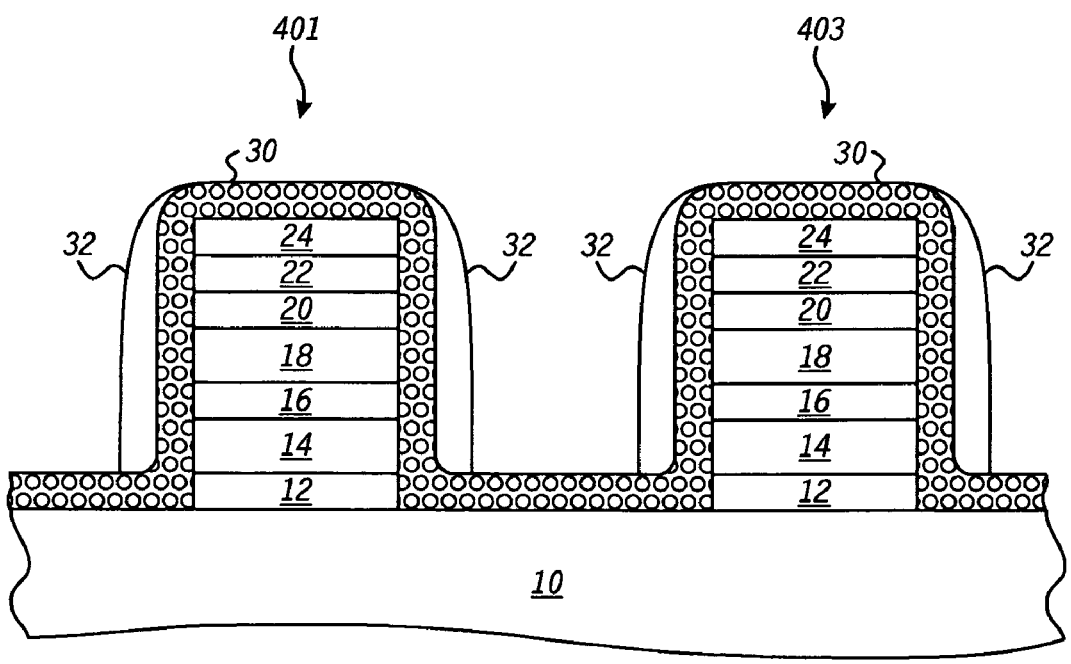
FIG. 6 is a view of the workpiece of FIG. 5 after forming spacers along the sidewalls of the stack and the charge storage material layer.

FIG. 6 illustrates one embodiment of the workpiece 9 subsequent to the formation of spacers 32 abutting the vertical sidewalls of the structures at multi-bit cell locations 401 and 403. The spacers 32 can be formed using conventional and proprietary techniques known in the art. The spacers 32 are formed in part to protect the memory bit cells' charge storage structures formed from layer 30 at locations 401 and 403. Suitable materials for the spacers 32 can include nitrides, such as silicon oxy-nitrides, or other silicon nitrides and metal nitrides or combinations thereof, or the like. In one embodiment, the spacers 32 are made of the same or a similar material to layer 22, to facilitate later processing. The spacers 32 can be formed using techniques such as a deposition process followed by an anisotropic etch. Accordingly, it will be appreciated that the formation of the spacers 32 can include an oxidation process and as such may include the formation of multiple films of materials.

Figure 7:
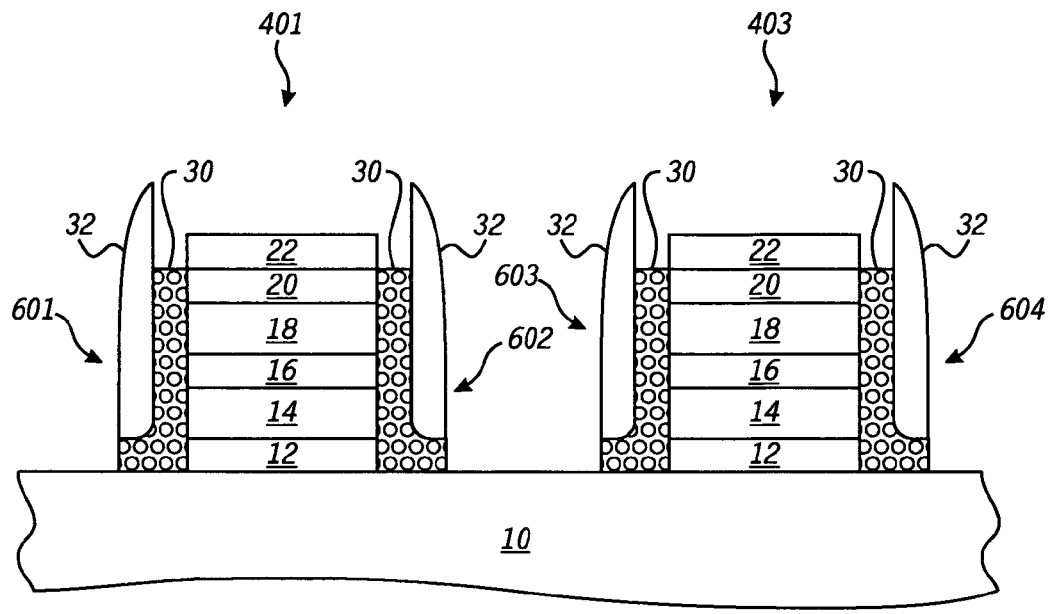
FIG. 7 is a view of the workpiece of FIG. 6 after removing portions of the charge storage layer, the mask and one of the additional layers.

Referring to FIG. 7, the layer 24 and portions of the layer 30 are removed. According to one embodiment, layer 24 and portions of layer 30 can be removed using a known conventional or proprietary etch process. According to the embodiment illustrated in FIG. 7, the etching removes a portion of layer 30, but leaves a portion of layer 30 at the sidewall regions 601-604. According to one embodiment, layer 30 and layer 24 can be removed together or separately using similar or different etch processes. In one embodiment, layer 22 is formed from a material different from layer 24 to facilitate removal of layer 24 while leaving as substantial portion of layer 22. Accordingly, the selective etch process can also be a dry etch or wet etch. It will be appreciated that the removal of these layers can be completed in a different manner using alternate techniques while still retaining layer 30 at the vertical side wall regions 601-604 of the memory bit cell locations 401 and 403. The resulting charge storage structures formed from layer 30 are at regions parallel to, and continuous along sidewall portions of the structures remaining from stack 19 that include gates being formed from layers 18 and 14, and wherein a major surface of the charge storage structure is substantially perpendicular (vertical as illustrate) to the major surface of the substrate 10. With respect to the gates formed by conductive layers 14 and 18 of the original stack 19 the charge storage structure is adjacent to both gates, and continuous along them, as illustrated in FIGS. 7-15.

Figure 8:
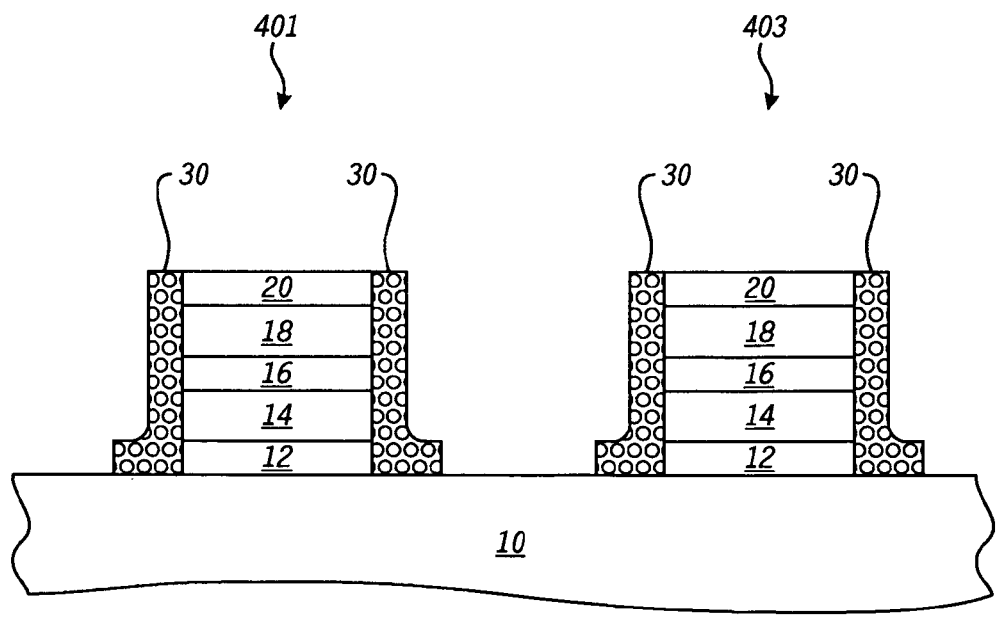
FIG. 8 is a view of the workpiece of FIG. 7 after removing the spacers from the sidewalls and the top of the multi-bit cell structures.

FIG. 8 illustrates the multi-bit cell portions at locations 401 and 403 after the removal of the spacers 32 and layer 22. The removal of the spacers 32 and layer 22 may be achieved using known conventional and proprietary techniques, such as a wet etch, dry etch, or the like. According to one embodiment, the etch process is an isotropic wet or dry etch. As will be appreciated, the type of etch process will be dependent upon the material of the spacers 32. As such, spacers 32 and layer 22 can be removed using the same etch process if they are the same or similar materials, however, individual removal steps are also suitable.

Figure 9:
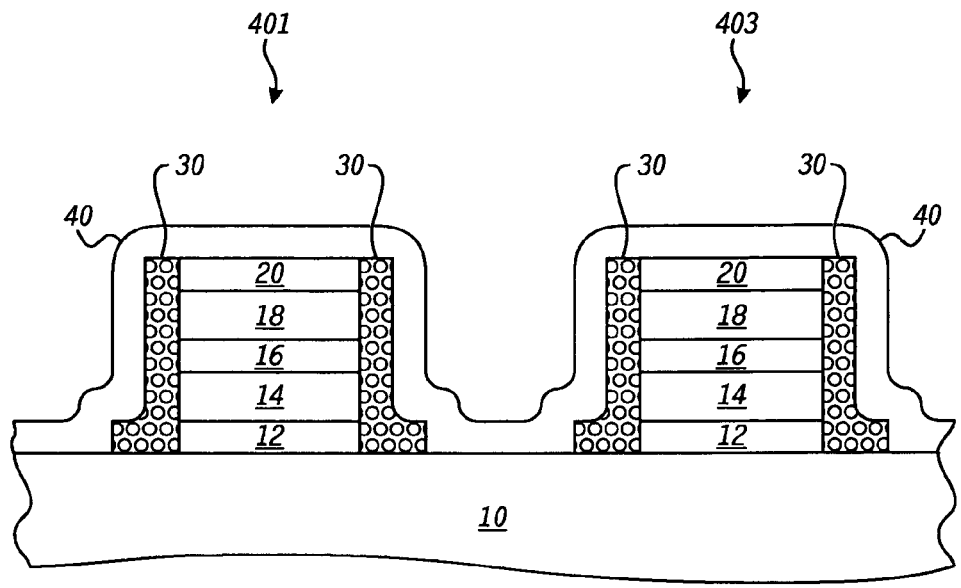
FIG. 9 is a view of the workpiece of FIG. 8 after forming a multi-gated active portion of the substrate, the stack and the charge storage material layer.

FIG. 9 illustrates a specific embodiment where a layer 40 has been formed over the workpiece 9. In one embodiment, layer 40 includes a semiconductor element from which a multi-gated active structure will be subsequently formed at each sidewall of the multi-bit cell structures at locations 401 and 403. Note that layer 40 as illustrated includes portions that are adjacent and parallel the sidewall surface of charge storage structures 30, which are substantially perpendicular the major surface of the substrate 10. As such, layer 30 is between layer 40 and the structures formed from the layers of stack 19 that form multi-gate stacks. A first plane is defined by an interfacial region between layer 40 and layer 30. Additionally, a second plane is defined by a surface of layer 40 that is opposite its first surface, wherein the first plane of layer 40 is between the second plane of layer 40 and the multi-gate structures formed from the layers of stack 19. As will be described in more detail below, during particular operations of the memory bit cell structure, multi-gated active structures facilitate generating charge mobility regions allowing charge elements to move along portions of the first interfacial region and a second interfacial region that will be formed at the second plane.

According to one embodiment, layer 40 comprises a semiconductor element. For example, layer 40 can be polysilicon, amorphous silicon, or nano-crystalline silicon deposited by a chemical vapor deposition process. In another embodiment, layer 40 is monocrystalline, formed using an epitaxial growth process. Layer 40 may include one or more other materials deposited by another process, such as chemical vapor deposition, or atomic layer deposition. Layer 40 can be doped when deposited or subsequent to its formation. Typically the thickness of layer 40 is in a range of approximately 10 nm to approximately 100 nm, and in a finished device, remaining portions of layer 40 have a dopant concentration of at least $5 \times 10^{17}$ atoms/cm$^3$ to facilitate formation of channel regions when layer 40 includes polysilicon. Layer 40 can be formed by known conventional and proprietary techniques such as deposition or growth. If layer 40 is deposited it may substantially overlay the surfaces of the workpiece as illustrated in FIG. 9.

The formation of layer 40 facilitates the formation of two interfacial regions. One interfacial region is substantially consistent with the first plane of layer 40 at a boundary region between layer 30 and layer 40 along which charge can be moved and through which charge can pass during charge storage operations. The second interfacial region is substantially consistent with the second plane of layer 40 at the boundary region between layer 40 and an overlaying dielectric layer 60 (described subsequently, see FIG. 12) and defines a channel region along which charge elements can be moved during a read operation.

Figure 10:
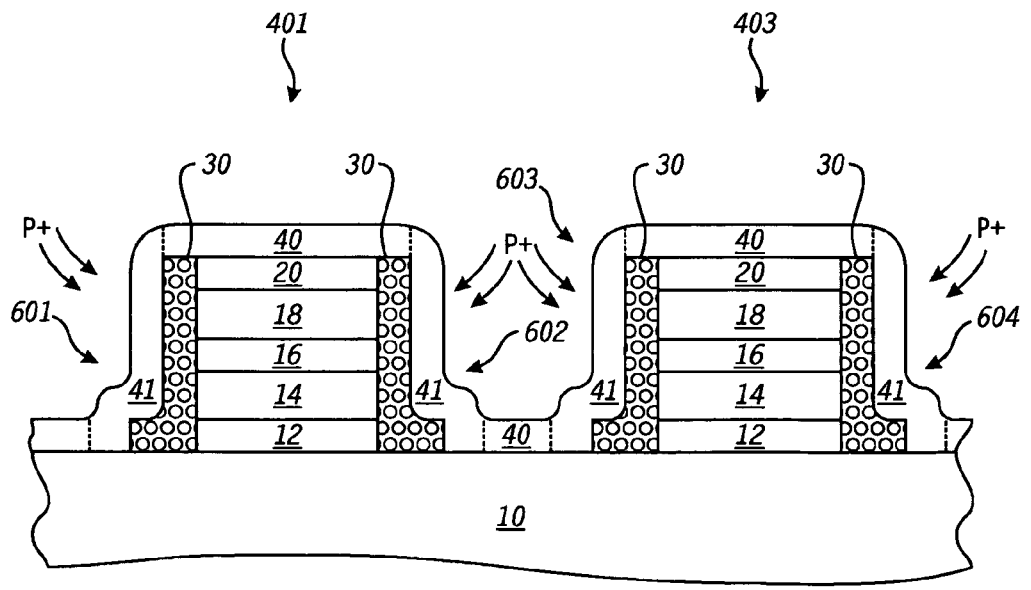
FIG. 10 is view of the workpiece of FIG. 9 during doping of sidewall regions of the multi-bit cell structures.

FIG. 10 illustrates the formation of layer 41 by doping layer 40 along the vertical sidewalls regions 601-604 of the multi-bit cell structures at multi-bit cell locations 401 and 403. According to the illustrated embodiment of FIG. 10, layers 40 and 41 separated by a dashed line since the interface is a dopant concentration gradient which may not be as well defined as other interfaces, such as an interface between layers of different materials. It will be appreciated that the doping of the sidewall regions 601-604 provides a well implant region for the provision of a channel region within layer 41. According to one embodiment, the doping can be conducted at an angle to the vertical surface of the sidewall regions 601-604 and the major surface of the substrate 10, as illustrated in FIG. 10. Additionally, the doping of the sidewall regions 601-604 can be completed in a plurality of procedures. For example, sidewall regions 601 and 603 can be doped during a first doping procedure, because the orientation of the workpiece 9 relative to the ion source facilitates the angular doping of the corresponding sidewall regions 601 and 603 of the memory bit cells at memory bit cell locations 401 and 403. After doping regions 601 and 603, a second doping procedure can be completed in which the substrate is rotated 180° to alter the orientation of the workpiece 9 relative to the ion source, thereby facilitating the angular doping of sidewall regions 602 and 604 of the memory bit cells at memory bit cell locations 401 and 403. It will be appreciated that the degree of ion implantation within sidewall regions 601-604 can account for counter-doping effects of subsequent implanting procedures, such as the formation of source/drain regions. Suitable dopants include acceptor (P-type) dopants such as boron and indium.

Figure 11:
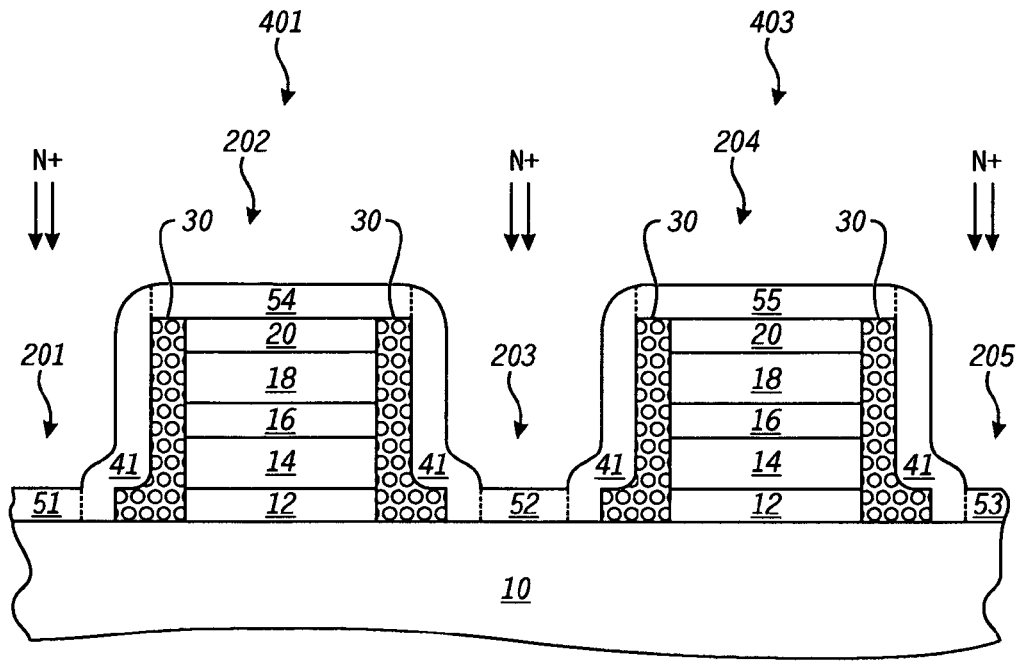
FIG. 11 is a view of the workpiece of FIG. 10 after forming a conductive layer over portions of the substrate and multi-bit cell structures.

FIG. 11 illustrates workpiece 9 after the formation of bit lines 51, 52, 53, 54 and 55 (51-55). According to a particular embodiment, bit lines 51-55 are formed by ion implantation of a dopant at surface regions 201, 202, 203, 204 and 205 of the portions of layer 40 that were not previously doped to form layer 41. Again, according to the illustrated embodiment of FIG. 11, the dashed lines indicate an interface formed as a result of doping a material layer. Suitable dopants include N-type (donor) dopants such as phosphorous and arsenic. It will be appreciated that doping surface regions 201-205 at an angle substantially perpendicular to the surface of the substrate 10 facilitates reduced counter-doping effects of previously formed implantations, such as those in sidewall regions 601-604 formed in layer 41.

Figure 12:
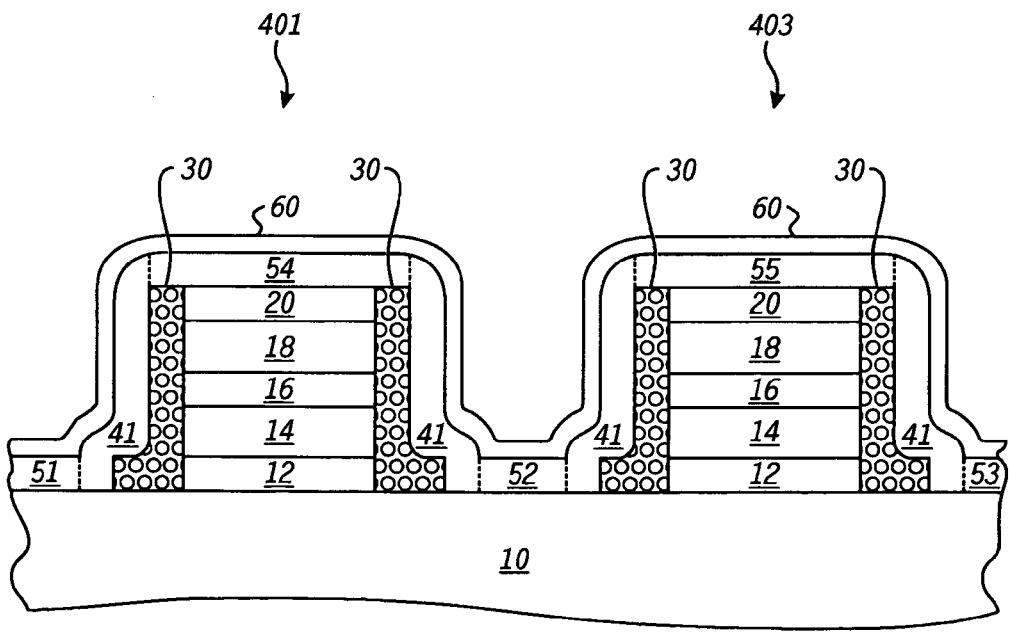
FIG. 12 is a view of the workpiece of FIG. 11 after forming an oxide layer over substantially all the structures illustrated.

Referring to FIG. 12, a dielectric layer 60 is formed over the illustrated portion of workpiece 9. The dielectric layer 60 can include a variety of materials such as silicon dioxide, silicon nitride, silicon oxynitride, a high dielectric constant ("high-k") material (e.g., dielectric constant greater than 8), or any combination thereof. The high-k material can include $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, $ZrO_2$, other Hf-containing or Zr-containing dielectric material, a doped version of any of the foregoing (lanthanum doped, niobium doped, etc.), or any combination thereof. According to one embodiment, the dielectric layer 60 may be thermally grown using an oxidizing or nitridizing ambient, or deposited using a conventional chemical vapor deposition technique, physical vapor deposition technique, atomic layer deposition technique, or a combination thereof. If dielectric layer 60 is deposited, it can be deposited over substantially all of the exposed surfaces of the workpiece, as illustrated in FIG. 12. According to one embodiment, dielectric layer 60 has a thickness less than approximately 5 nm. As such, in some embodiments the dielectric layer 60 has a thickness less than approximately 2 nm.

Figure 13:
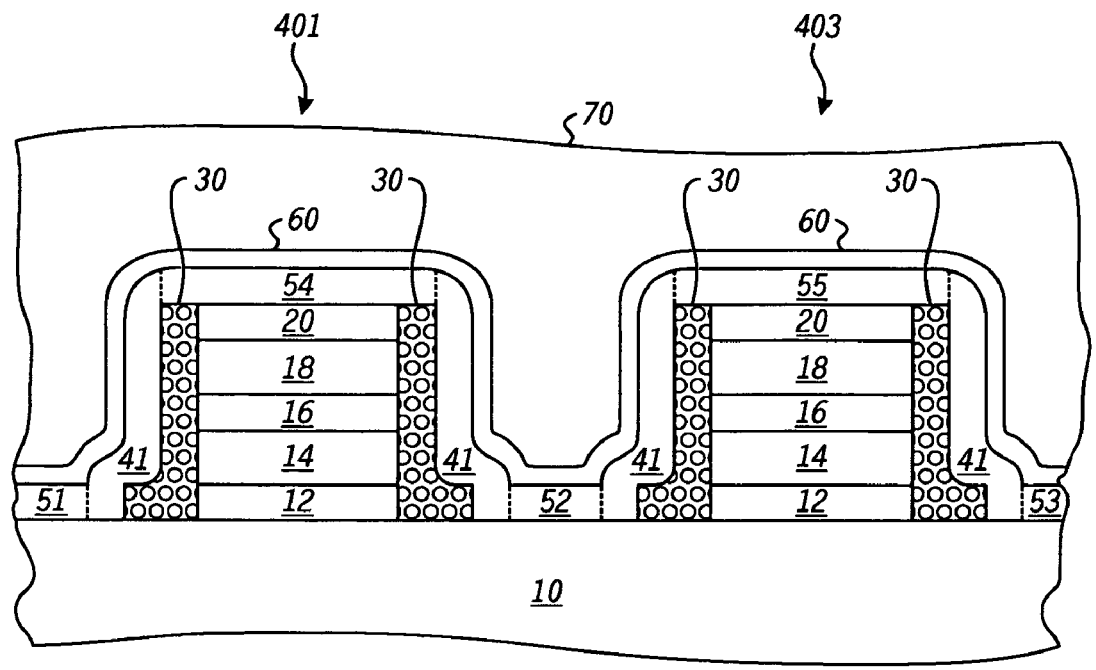
FIG. 13 is a view of the workpiece of FIG. 12 after forming a conductive layer over the illustrated portion of the workpiece.

FIG. 13 illustrates a specific embodiment including a conductive layer 70 overlaying the multi-bit cell locations 401 and 403 at the illustrated portion of workpiece 9. As illustrated, a portion of dielectric layer 60 is between layer 70 and the active region formed from layer 41. Suitable materials for the conductive layer 70 can include a variety of conductive materials including metals, doped materials, and the like. Doped materials can include doped polysilicon, while metals can include aluminum, copper, titanium, and the like. In one embodiment, conductive layer 70 functions as a word line that facilitates biasing the multi-bit cell structures at memory bit cell locations 401 and 403 during program, erase and read operations, as described in more detail below.

Figure 14:
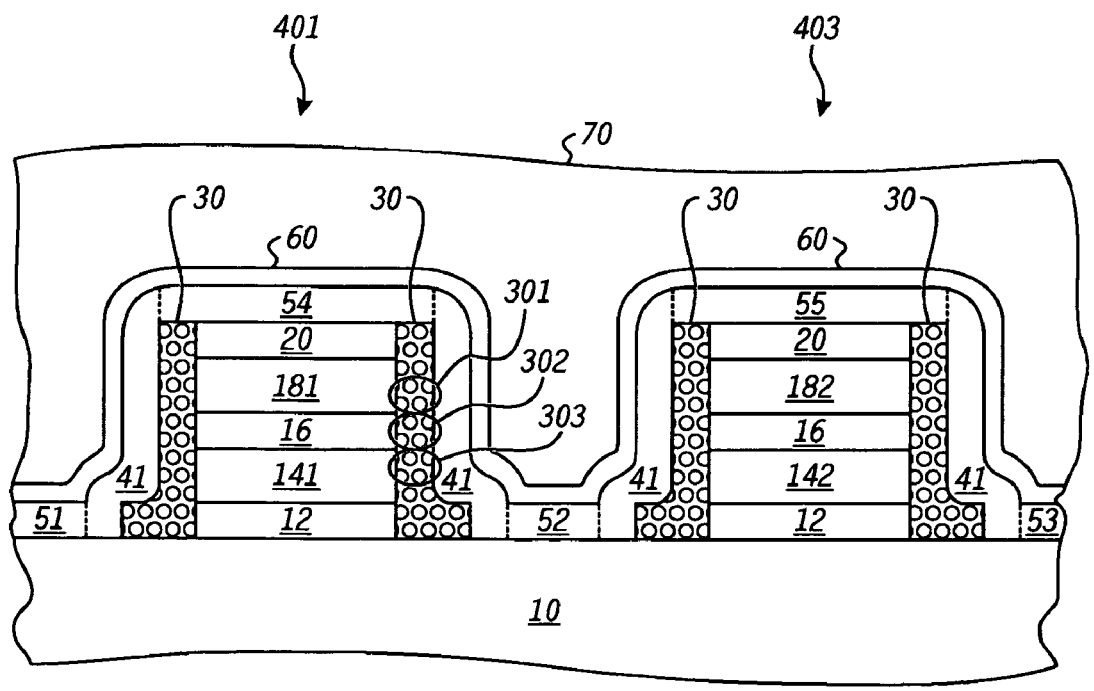
FIG. 14 is a view of the workpiece of FIG. 13 with designated bit cell storage regions used in conjunction with Table 1.

FIG. 14 illustrates an embodiment with particularly identifying bit storage regions 301 and 303, as well as region 302 of the multi-bit cell structures at multi-bit cell locations 401 and 403 for use in conjunction with Table 1 provided below. For additional clarity, the conductive gates at locations 401 and 403 have been assigned unique reference numbers 181, 182, 141, and 142. Bit storage regions 301 and 303 are adjacent conductive gates 181 and 141 respectively, and store charge associated with a first data bit and a second data bit the charge storage region 301. Such an erase procedure also erases charge storage region 303.

During a read operation of charge storage region 301, a positive bias is applied to bit lines 52, 53 and 55 (about 1.0V), and bit lines 51 and 54 are near ground (about 0V), while the word line 70 and source gate 141 have a strong positive bias (each approximately 2-4 V). Due to the biasing of the gates, bit lines and word lines as such, a channel for the flow of electrons is formed proximate to the interface of layer 41 and

TABLE 1

Program, erase, and read voltages for three bit cells
for a particular embodiment illustrated in FIG. 14.

|  | First Bit (301) | | | Second Bit (303) | | |
| --- | --- | --- | --- | --- | --- | --- |
|  | Program V | Erase V | Read V | Program V | Erase V | Read V |
| Bit Line 1 (51) | +(3-4) | Flt-Grnd | 0 | Grnd | Flt-Grnd | 1 |
| Bit Line 2 (54) | +(3-4) | Flt-Grnd | 0 | Grnd | Flt-Grnd | 1 |
| Bit Line 3 (52) | Grnd | Flt-Grnd | 1 | +(3-4) | Flt-Grnd | 0 |
| Bit Line 4 (55) | Grnd | Flt-Grnd | 1 | +(3-4) | Flt-Grnd | 0 |
| Bit Line 5 (53) | Grnd | Flt-Grnd | 1 | +(3-4) | Flt-Grnd | 0 |
| First Upper Source Gate (181) | +(5-7)+ | –(5-7) | 0 | +(5-7) | –(5-7) | 2-4 |
| First Lower Source Gate (141) | +(5-7) | –(5-7) | 2-4 | +(5-7)+ | –(5-7) | 0 |
| Second Upper Source Gate (182) | Neg - Grnd | –(5-7) | 0 | Neg - Grnd | –(5-7) | 0 |
| Second Lower Source Gate (142) | Neg - Grnd | –(5-7) | 0 | Neg - Grnd | –(5-7) | 0 |
| Word Line (70) | Grnd | +(5-7) | 2-4 | Grnd | +(5-7) | 2-4 |
| Other Word Lines | Neg | N/A | Neg | Neg | N/A | Neg |

Table 1, in conjunction with FIG. 14 is provided to further the understanding of operation in accordance with one particular embodiment. During a programming procedure of charge storage region 301, negative charge elements, such as electrons, flow from bit line 52 (having a bias of approximately 0V) toward bit line 54 (having a bias of approximately 3-4V). Since gates 181 and 141 are both biased with a strong positive voltage (approximately 5-7V), a channel for charge movement is formed in the multi-gated active structure, proximate to the interfacial region of layer 30 and layer 41. Because gates 181 and 141 are both biased with a strong positive bias, the channel resistance in regions 301 and 303 adjacent gates 181 and 141 respectively, is low, while the resistance at the adjacent interfacial region 302, between the charge storage regions 301 and 303 is of a higher resistance. The biasing of the system as such generates a high electric field in region 302, thereby accelerating charge elements, such as electrons, away from region 303 toward region 301, through region 302 and injecting the charge elements into charge storage region 301. By biasing gate 181 at a higher voltage than gate 141 (designated by the "+" sign in Table 1), the accelerated electrons are injected into charge storage region 301.

During an erase procedure of charge storage region 301, the polarities of the gates are generally reversed in relation to a programming procedure. Gates 181 and 141 are both biased with a strong negative voltage (approximately −5-7V), however the bias is a strongly negative bias, thereby repelling negatively charged elements, such as electrons, that were previously stored in charge storage region 301. The word line 70 has a positive bias (approximately +5-7V) thereby attracting the electrons away from the charge storage region 301, while positively charge elements, such as holes, are repelled by the word line 70 and attracted to the charge storage region 301. As a result, the electrons are removed from the charge storage region 301 and, in some cases even replaced with holes, thereby erasing any information that had been stored in layer 60. If charge storage region 301 is at a programmed state, that is, electrons will are present within charge storage region 301, independent of the fact that the channel region adjacent charge storage region 303 is conductive, no substantial channel will be formed associated with region 301 for the system bias as described above. Therefore, little or no current will flow from bit line 52 to bit line 54 and the system will determine that a charge is stored at charge storage region 301. If charge storage region 301 is at an erased state, that is, charge storage region 301 contains a positive or neutral charge, the biasing will allow a channel to be formed and current will flow from bit line 52 to bit line 54. Therefore the system will determine that the charge storage region 301 is in an erased state.

It will be appreciated that the read procedure and the program procedure utilize different channel regions, which are vertically opposing interfaces of layer 41 relative to the major surface of the substrate. The channel region during a read operation relies on conduction near the interface between layer 41 and 60, while the programming operation relies on conduction between layer 30 and 41. The different channel regions utilized during read and programming procedures facilitates an improved sensing effect during read operations because the read channel is not subject to utilizing the same channel as the channel utilized during programming where channel degradation effects caused by hot carrier injection during programming can occur. The utilization of different channel regions for different read and programming procedures also facilitates a device that has improved speed and responsiveness.

In continued reference to Table 1 and FIG. 14, a programming operation for charge storage region 303 is provided. During a programming procedure of charge storage region 303, negative charge elements, such as electrons, flow from bit line 54 (having a bias of approximately 0V) toward bit line 52 (having a bias of approximately 3-4V). Since gates 181 and 141 are both biased with a strong positive voltage (approximately 5-7V), a channel for charge movement is at the interfacial region between layer 30 and layer 41. Because gates 181 and 141 have a strong positive bias, the channel resistance in regions 301 and 303 adjacent gates 181 and 141 respectively, is low, while the resistance at the adjacent interfacial region 302, between the charge storage regions 301 and 303 is of a higher resistance. As a result, a high electric field will occur in region 302, causing electrons to accelerate as the electrons travel away from region 301 toward region 303, through region 302. By biasing gate 141 at a higher voltage than gate 181 (designated by the "+" sign in Table 1), the accelerated electrons are injected into charge storage region 303.

During an erase procedure of a charge storage region 303, the polarity of the system is the same as the erase procedure for charge storage region 301, discussed previously. Gates 181 and 141 have a strongly negative bias (approximately −5-7V), while the word line has a strong positive bias (approximately +5-7V). Biasing the system as such facilitates repelling electrons from charge storage region 303 and attracting positively charged holes into charge storage region 303 to erase any information that may have been stored within charge storage region 303.

The biasing of the system for a read procedure of charge storage region 303 is similar to the conditions during a read procedure of charge storage region 301. During a read operation of charge storage region 303, a positive bias is applied to bit lines 51, and 54 (about 1.0V), bit lines 52, 53 and 55 are near ground (about 0V), and the word line 70 and source gate 181 have a strong positive bias (each approximately 2-4 V). Due to the biasing of the gates, bit lines, and word line as such, a channel for the flow of electrons is formed in proximity to the interface of layer 41 and layer 60. It will be appreciated that this channel region is formed at a different interface than the channel region for a program procedure. If charge storage region 303 is at a programmed state, that is, electrons are present within charge storage region 303, independent of the fact that the channel region adjacent charge storage region 303 is conductive, no substantial channel will be formed associated with region 303 for the system bias as described above. Therefore, little or no current will flow from bit line 54 to bit line 52 as the channel is not conductive and the system will sense that a charge is stored at charge storage region 303. If the charge storage region 303 is at an erased state, that is charge storage region 303 contains a positive or neutral charge, the biasing will allow a channel to be formed and current to flow from bit line 54 to bit line 52, and the system senses that the charge storage region 303 is at an erase state.

It will be appreciated that other charge storage regions associated with other non-volatile memory bit cells such as those at memory bit cell locations 401 and 403 will utilize the same or similar program, erase and read procedures. It will be further be appreciated that the height of the memory bit cells at memory bit cell locations 401 and 403 influences in part, the height of the charge storage regions 301 and 303 illustrated in FIG. 14. Accordingly, the height of the channel region defined primarily by the height of the memory bit structure must not be substantially greater than the height of the charge storage regions. As such, the thickness of the source gates 141 and 181 is typically not greater than about 90 nm, such as not greater than about 50 nm. Such a thickness of source gates 141 and 181 is suitable to affect sufficient charge storage for a substantial portion of the memory bit cell thereby providing effective operation. Furthermore, the relation between the thickness of layer 41 relative to the height of the memory bit cell structure influences the conduction mechanics of the channel regions and as stated previously a thickness of layer 41 is within a range of between 10 nm and 100 nm.

Figure 15:
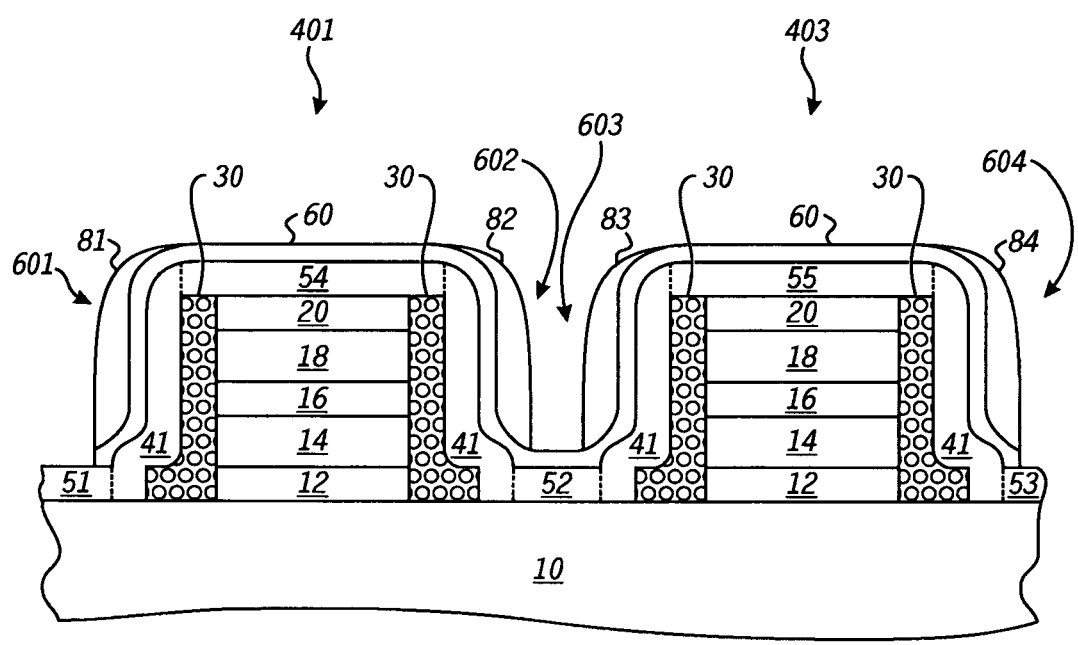
FIG. 15 is a view of the workpiece of FIG. 12 after removing portions of the oxide layer and forming conductive layers along the sidewalls of the stacks.

An alternative embodiment is illustrated in FIG. 15 in which outer control gate structures 81, 82, 83, and 84 (81-84) acting as multiple word lines are formed on vertical side wall regions 601-604 at multi-bit cell locations 401 and 403 are formed. Suitable materials for the outer control gate structures 81-84 include conductive materials such as metals, such as titanium, or a titanium-containing material. In one embodiment, outer control gate structures 81-84 are made of polysilicon, such as doped polysilicon. As such, outer control gate structures 81-84 facilitate biasing of the multi-bit cell structures at multi-bit cell locations 401 and 403 during program, erase and read operations.

It will be appreciated that particular embodiments have illustrated a charge storage region including layer 30 that illustrates discontinuous charge storage elements substantially surrounded by a dielectric material. However, a variety of other charge storage structures are available and in fact, any material layer capable of holding a charge is suitable for forming charge storage regions in accordance with embodiments herein.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

In the foregoing specification, principles of the disclosure have been described above in connection with specific embodiments. However, one of ordinary skill in the art appreciates that one or more modifications or one or more other changes can be made to any one or more of the embodiments without departing from the scope of the disclosure as set forth in the claims below. Accordingly, the specification and figures are to be regarded in an illustrative rather than a restrictive sense and any and all such modifications and other changes are intended to be included within the scope of disclosure.

What is claimed is:

1. A method comprising:
   forming a first control gate overlying a major surface of a substrate for an electronic device;
   forming a second control gate overlying the first control gate and spaced apart from the first control gate; and
   forming a charge storage structure adjacent to, and continuous along the first control gate, the second control gate, and a region between the first control gate and the second control gate, wherein a major surface of the charge storage structure is substantially perpendicular to the major surface of the substrate.

2. The method of claim 1, wherein forming the charge storage structure comprises forming a first region of the charge storage structure associated with the first control gate to store charge associated with a first data bit, wherein the first region is substantially surrounded by a dielectric.

3. The method of claim 2, wherein forming the charge storage structure comprises forming a second region of the charge storage structure associated with the second control gate to store charge associated with a second data bit, wherein the second region is substantially surrounded by a dielectric.

4. The method of claim 3, wherein the charge storage structure comprises discontinuous storage elements.

5. The method of claim 1, further comprising:
forming a multi-gated active structure adjacent to the charge storage structure, the multi-gated active structure comprising a first surface and a second surface, the first surface along a first plane substantially defining a first interfacial region between the first surface and the charge storage structure, and the second surface along a second plane, wherein the second surface opposes the first surface such that they are substantially parallel.

6. The method of claim 5, further comprising:
forming a conductive layer over the multi-gated active structure.

7. The method of claim 5 further comprising:
injecting charge elements into the charge storage structure from the first interfacial region; and
generating a charge mobility region along the second plane of the multi-gated active structure during a read of the charge storage region.

8. The method of claim 7, wherein injecting further comprises:
moving charge elements along a first portion of the first interfacial region, wherein the first portion of the first interfacial region is closer to the first control gate than to the second control gate;
moving charge elements along a second portion of the first interfacial region, wherein the second portion of the first interfacial region is closer to the second control gate than the first control gate; and;
generating an electric field between the first and second portions of the first interfacial region to accelerate the charge elements, wherein injection of the charge elements into the first region occurs at a third portion of the first interfacial region associated with the second control gate in response to the charge elements accelerating through the electric field, wherein the third portion of the first interfacial region is between the first and second portions of the first interfacial region.

9. The method of claim 7, wherein generating the charge mobility region comprises biasing a non-volatile memory device comprising the change storage region to move charge elements to be sensed along the second plane, the method further comprising, sensing the charge elements moved along the second interfacial region.

10. The method of claim 9, wherein the second plane is at a second interfacial region.

11. The method of claim 10, wherein the second interfacial region is formed between the second surface of the multigated active structure and a dielectric.

12. The method of claim 5 further comprising:
forming a dielectric structure adjacent the multi-gated structure, wherein the multi-gate active structure is between the dielectric structure and the charge storage structure.

13. The method of claim 1, further comprising:
generating an electric field in a region between the first and second control gates; and
accelerating charge elements in the electric field to facilitate injecting first charge elements into a first storage region.

14. The method of claim 13, wherein the method further comprises:
generating an electric field in a region between the first and second control gates; and
accelerating charge elements in the electric field to facilitate injecting second charge elements into a second storage region.

15. The method of claim 14, wherein the method further comprises:
injecting the first and second charge elements into the charge storage structure through a first interfacial region.

16. The method of claim 13, wherein generating the electric field comprises providing a first potential on the first control gate and providing a second potential on the second control gate, wherein the second potential is less than the first potential.

17. The method of claim 1 wherein forming the first control gate and forming the second control gate are part of forming a multi-gate stack that further comprises forming a dielectric layer between the first control gate and the second control gate.

18. The method of claim 17, wherein the charge storage structure is a first charge storage structure formed adjacent to a first sidewall of the multi-gate stack; and claim 17 further comprising:
forming a second charge storage structure adjacent to, and continuous along a second sidewall of the multi-gate stack, wherein the first and second sidewalls of the multi-gate stack are opposing sidewalls and a major surface of the second charge storage structure is substantially perpendicular to the major surface of the substrate.

19. The method of claim 18, wherein the charge storage structure comprises discontinuous storage elements.

* * * * *